United States Patent [19]

Nambu et al.

[11] Patent Number: 5,109,270
[45] Date of Patent: Apr. 28, 1992

[54] HIGH FREQUENCY SEMICONDUCTOR DEVICE

[75] Inventors: Shutaro Nambu, Uji; Osamu Ishikawa, Soraku; Chinatsu Azuma, Kyoto, all of Japan

[73] Assignee: Matsushita Electric Industrial Co., Ltd., Osaka, Japan

[21] Appl. No.: 728,324

[22] Filed: Jul. 8, 1991

Related U.S. Application Data

[63] Continuation of Ser. No. 507,500, Apr. 11, 1990, abandoned.

[30] Foreign Application Priority Data

Apr. 17, 1989 [JP] Japan .................................. 1-097114

[51] Int. Cl.$^5$ ...................... H01L 21/60; H01L 23/48
[52] U.S. Cl. ......................................... 357/74; 357/68; 357/80
[58] Field of Search ...................... 357/74, 65, 68, 69, 357/70, 80

[56] References Cited

U.S. PATENT DOCUMENTS

| | | | |
|---|---|---|---|
| 3,561,107 | 2/1971 | Best et al. | 357/80 |
| 3,657,613 | 4/1972 | Brody et al. | 357/80 |
| 3,942,245 | 3/1976 | Jackson et al. | 357/80 |
| 4,200,975 | 5/1980 | Debiec et al. | 357/80 |
| 4,215,359 | 7/1980 | Schermer et al. | 357/70 |
| 4,232,512 | 11/1980 | Yoshikawa et al. | 368/276 |
| 4,413,308 | 11/1983 | Brown | 357/80 |
| 4,527,330 | 7/1985 | Sturm et al. | 357/70 |
| 4,607,276 | 8/1986 | Butt | 357/69 |
| 4,612,566 | 9/1986 | Kowata et al. | |
| 4,649,415 | 3/1987 | Hebert | 357/74 |
| 4,670,770 | 6/1987 | Tai | 357/74 |
| 4,736,236 | 4/1988 | Butt | 357/69 |

FOREIGN PATENT DOCUMENTS

| | | |
|---|---|---|
| 57-39559 | 3/1982 | Japan . |
| 59-143351 | 8/1984 | Japan . |
| 59-143352 | 8/1984 | Japan . |
| 60-80230 | 5/1985 | Japan . |
| 61135211 | 6/1986 | Japan . |
| 63-6852 | 1/1988 | Japan . |
| 01084624 | 3/1989 | Japan . |
| 0801143 | 1/1981 | U.S.S.R. . |

OTHER PUBLICATIONS

Hammerschmitt, "Microwave Semiconductors for SMT", Siemens Components, vol. XXII, No. 2, pp. 64-67, Apr. 1988.

Primary Examiner—Andrew J. James
Assistant Examiner—Viet Q. Nguyen
Attorney, Agent, or Firm—Stevens, Davis, Miller & Mosher

[57] ABSTRACT

A high frequency semiconductor device comprising metal electrode leads formed on one surface of a flexible film, a plurality of bumps formed on selected portions of the electrode patterns, a recessed portion formed on the flexible film within a region bounded by the plurality of bumps and a plurality of electrode pads of a high frequency semiconductor element respectively bonded to the bumps in alignment with each other.

4 Claims, 8 Drawing Sheets

HIGH FREQUENCY SEMICONDUCTOR DEVICE

This application is a Rule 62 continuation of application Ser. No. 507,500, filed Apr. 11, 1990, now abandoned.

BACKGROUND OF THE INVENTION

The present invention relates to a high frequency semiconductor device, and more particularly to packaging which can provide the semiconductor device with an excellent high frequency characteristic.

Figure 6A:
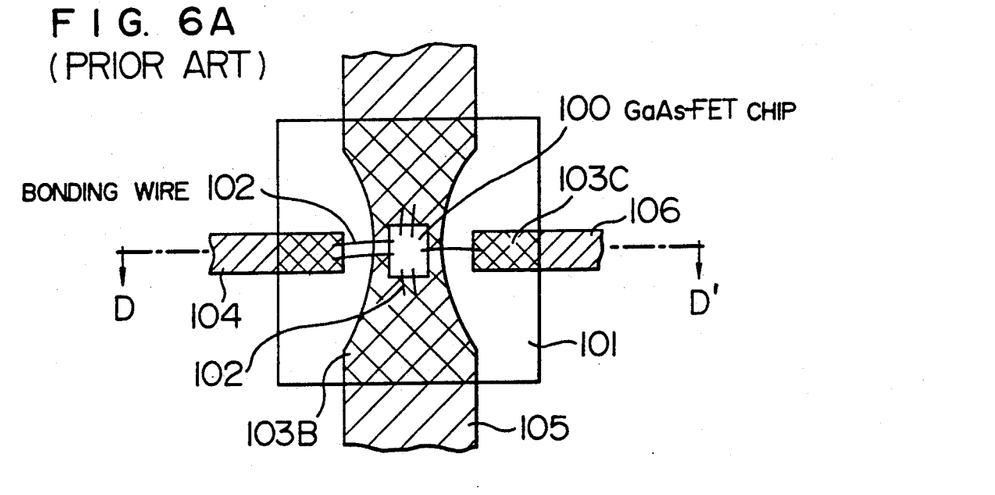
FIGS. 6A and 6B are a plan view and a sectional view of the prior art semiconductor device.
Figure 6B:
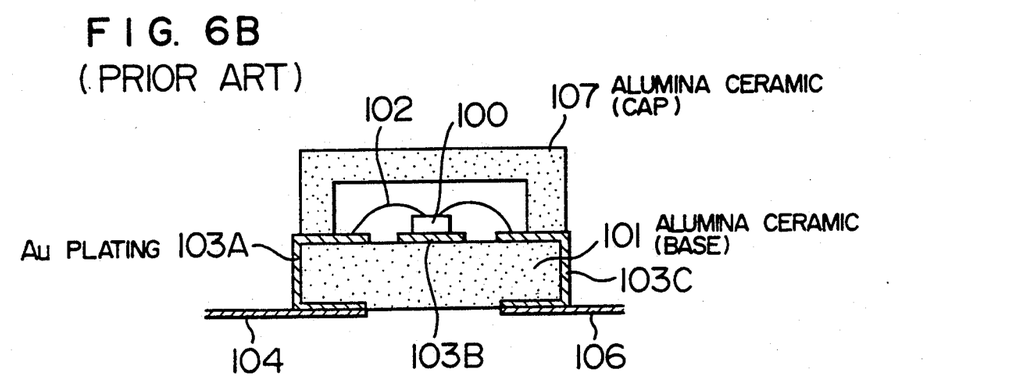

Referring to FIGS. 6A and 6B, the previous method for packaging a high frequency transistor (3GHz or higher), particularly a GaAs-FET (field effect transistor) will be explained. As shown in FIGS. 6A and 6B, a GaAs-FET chip 100 is sealed within a package consisting of a base 101 and a cap 107 both of which are made of alumina ceramic. In FIGS. 6A and 6B, 102 are bonding wires, and 103A, 103B and 103C are Au-plated layers with which a drain electrode lead 104, a source electrode lead 105 and a gate electrode lead 106 are connected, respectively.

Figure 7:
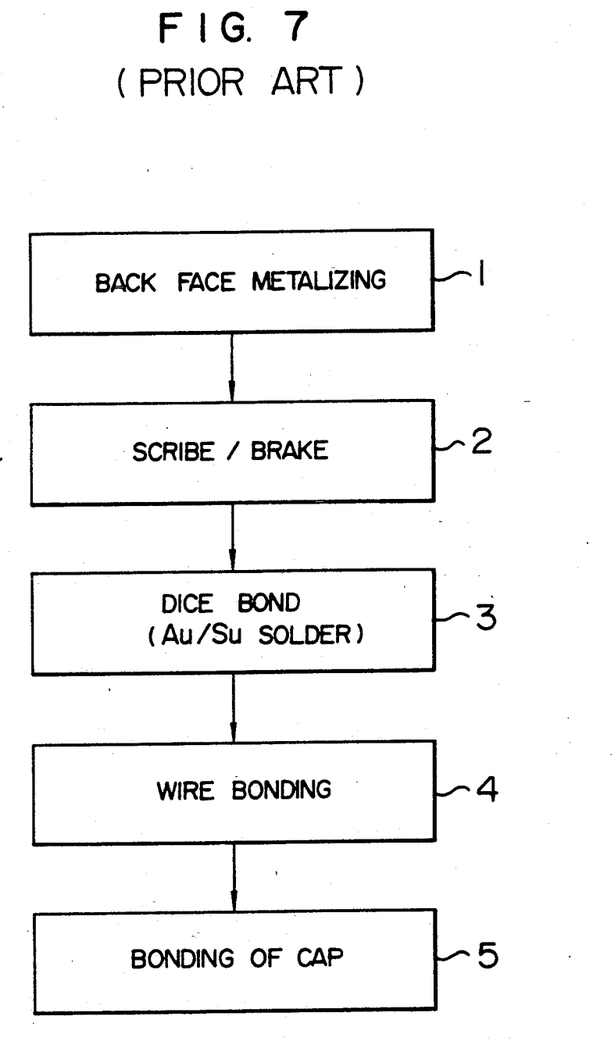
FIG. 7 is a flowchart of the prior art process of assembling a semiconductor device.

The schematic process for packaging such a GaAs-FET is shown in FIG. 7 of the flow chart. In Step 1, the back surface of a GaAs wafer, which has been ground and shaped to a prescribed thickness, is metallized with e.g. Au on which solder for dice bonding is to be applied. In Step 2, the wafer is scribed and broken into a number of chips. In Step 3, each of the chips is dice-bonded on the Au-plated layer 103B using e.g. an Au/Sn solder. In Step 4, wire-bonding is made for each of the chips by using bonding wires 102. In this step, it is important to make the source inductance as small as possible to improve the high frequency characteristic, particularly, the noise factor (F) and the gain (Ga). For this purpose, the length of bonding wires 102s is made as short as possible, and the number of the wire bondings is increased (4 in FIG. 6A). Finally, in Step 4, the cap 107 is bonded to the base 101.

Meanwhile, reduce fabricating costs for microwave semiconductor packages have been eagerly demanded; this demand is so great that it cannot be satisfied only by reducing the cost for semiconductor chips themselves. As a result, cost reductions with respect to assembling the semiconductor chip or packaging it have been eagerly demanded. Some microwave packages occupy in their assembling and mounting cost almost half the entire cost of the semiconductor device. However, the reduction in cost is limited as long as the conventional ceramic package is used. Further, the high performance of the semiconductor devices has been further required; this requirement also cannot be satisfied merely by improving the chips themselves, and so must be satisfied in the viewpoint of packaging. For example, in order to shorten the length of the above-described source wire, the "flip-chip bonding" technique has been proposed for a power FET; in the flip-chip bonding technique, bumps formed on the electrodes of a ceramic package are bonded with the pads on a chip which are provided in opposition to the bumps. However, this technique, which improves the performance but uses the ceramic package, is still expensive since it requires a step of forming bumps on the expensive ceramic body and cannot satisfy the requirement of low cost.

SUMMARY OF THE INVENTION

In view of such inconvenience, an object of the present invention is to provide a package which can realize the high frequency characteristic of a semiconductor device by low cost.

In order to attain this object, in accordance with the present invention, there is provided a high frequency semiconductor device comprising metal electrode patterns formed on one surface of a flexible film, a plurality of bumps partially formed on the electrode pattern, and a plurality of electrode pads of the high frequency semiconductor device bonded to the bumps in opposition to each other. In this case, a recessed portion is formed on the flexible film among the plurality of bumps. Preferably, the surface of a recessed portion formed on the flexible film is partially covered with the metal electrode pattern to be connected with the electrode pads.

Further, in accordance with the present invention, there is provided a high frequency semiconductor device comprising a plurality of lead frames, a plurality of bumps partially formed on a surface of the lead frames one of which has a recessed portion among the bumps. Moreover, a plurality of electrode pads of electrode pads of the high frequency semiconductor device are bonded to the bumps in correspondence each other.

In accordance with the present invention, the above flip-chip bonding technique, in which a high frequency semiconductor chip is bonded onto a metal pattern in the condition laid facedown which is opposite to the ordinary manner, can be carried out on a film carrier.

Further, use of metallic bumps permits not only the ordinary wire bonding step to be omitted but also the source inductance, which deteriorates the high frequency characteristic of the semiconductor device, to be restrained. Furthermore, use of the film carrier and provision of the bumps thereon permits the semiconductor device to be completed at a cost very much lower than that of the ceramic package, and also the floating capacitance to be restrained as compared with use of the ceramic carrier; this is very advantageous to realize the high performance of the semiconductor device.

Further, in accordance with the present invention, air isolation using a recessed portion (gap) is made for electrical isolation between the input and output of the semiconductor device, which is particularly essential for the high frequency semiconductor device, so that the electrical isolation performance can be greatly improved. Further, in accordance with the present invention, bumps are formed on a film carrier lead or a lead frame and thereafter the semiconductor chip is sealed to provide leads, so that the package can be provided at low cost.

DESCRIPTION OF THE PREFERRED EMBODIMENTS

Now referring to the drawings, several embodiments of the present invention will be explained.

Embodiment 1

Figure 1A:
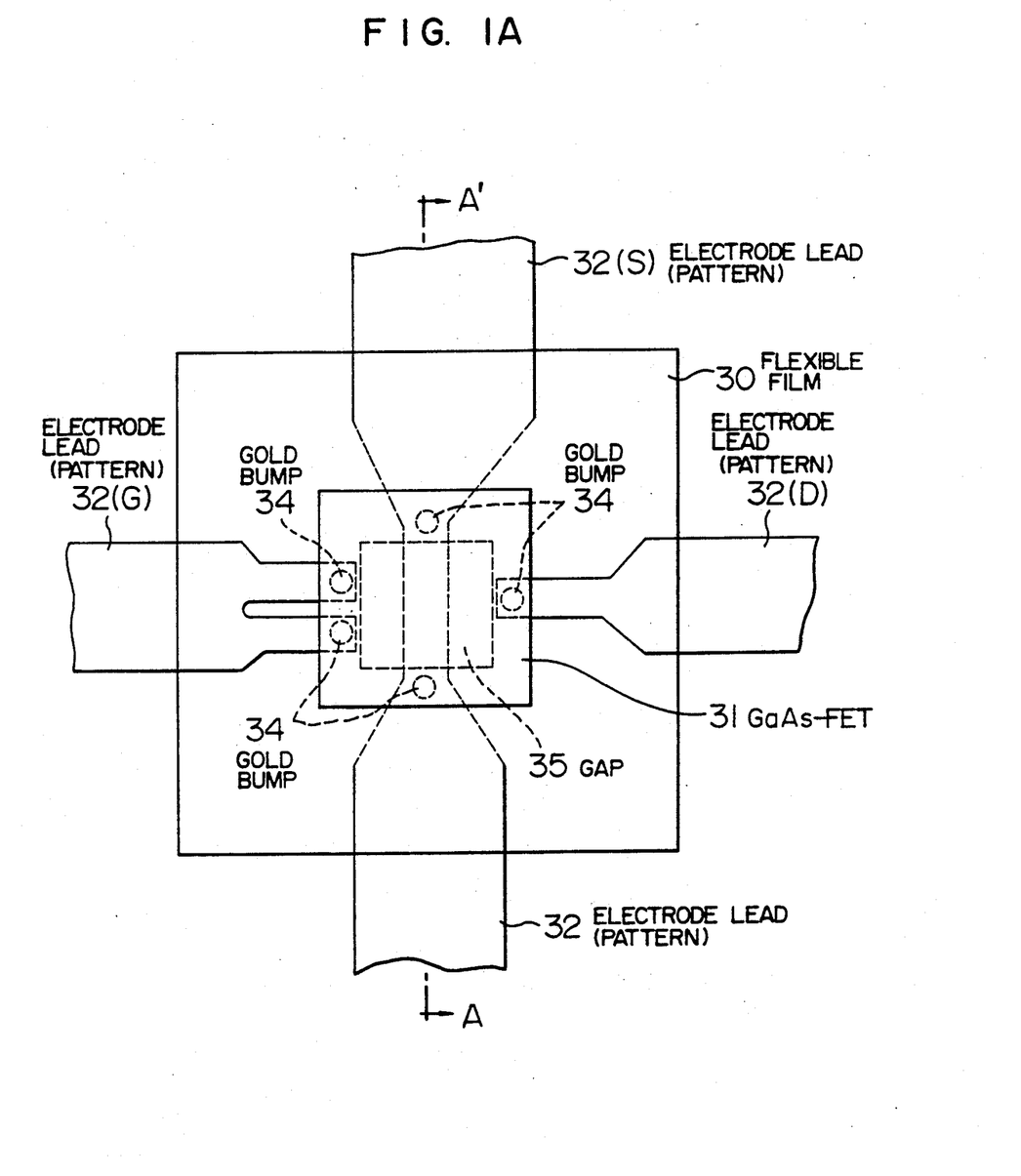
FIG. 1A is a plan view of the main par of a semiconductor device according to one embodiment of the present invention.
Figure 1B:
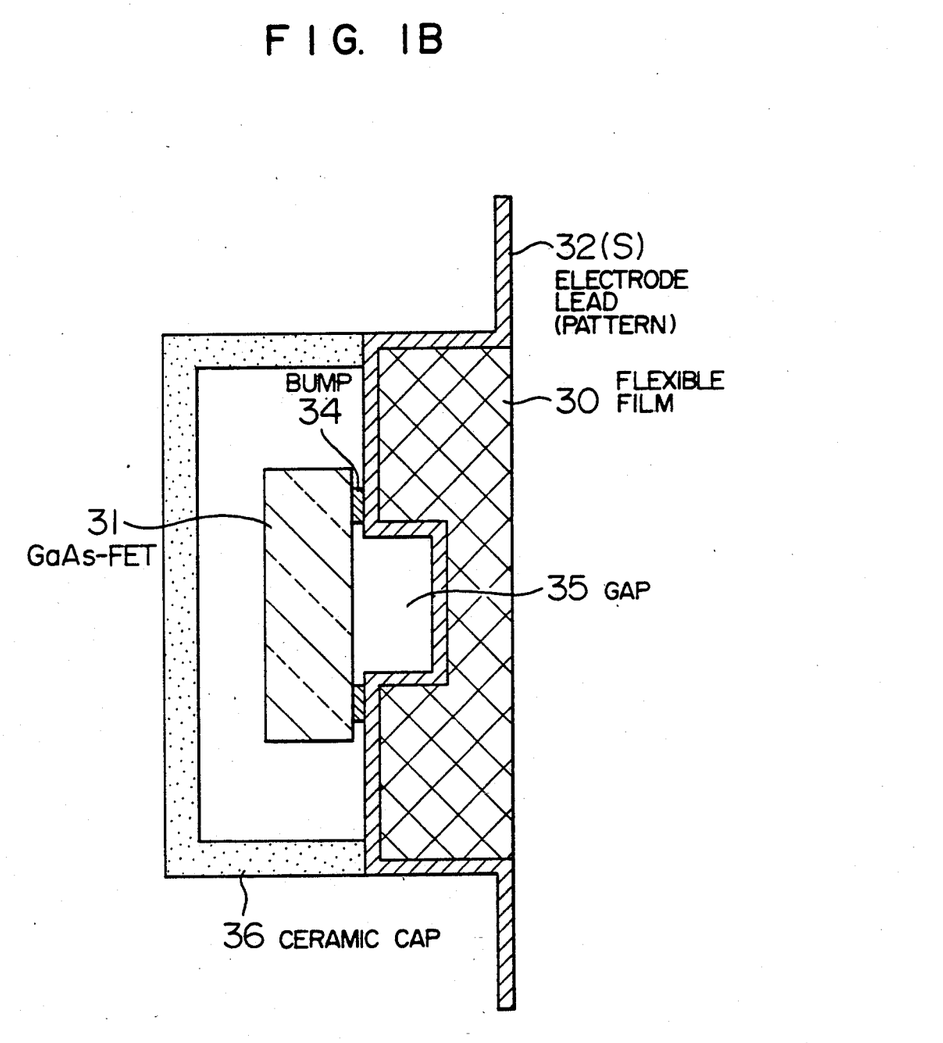
FIG. 1B is a sectional view taken along line A—A' of FIG. 1A.

As shown in FIGS. 1A and 1B, electrode leads 32 of metal patterns are formed on one main surface of a flexible film 30 of polyimide. Bumps 34 of gold are formed on the required positions on the electrode leads 32 by a technique such as duplicating bumping. For example, in this embodiment, the bumps 34 are formed on the leads 32 in alignment with the bonding pads of a GaAs-FET 31 chip as a high frequency semiconductor device for processing a signal at 3 GHz or higher. In the duplicating bumping technique, the bumps 34 can be formed by first forming bumps on a glass plate (not shown), bonding the bumps on the metal leads 32 and detaching the glass plate from the bumps so that the bumps are duplicated onto the metal leads 32. The bumps 34 may be also formed on the leads 32 by a technique other than the duplicating bumping. The GaAs-FET 31, which is a semiconductor chip, is positioned under recognition of the bumps 34 of the electrode leads 32 and the electrode pads on FET 31 for single bonding thereto. Additionally, 35 is a gap or recessed portion formed on the flexible film 30 between the bumps 34. A cap 36 of ceramic as shown in FIG. 1B is not shown in FIG. 1A. In the leads 32 shown in FIG. 1A, S is a source lead; D is a drain (output) lead; and C is a gate (input) lead.

Figure 2:
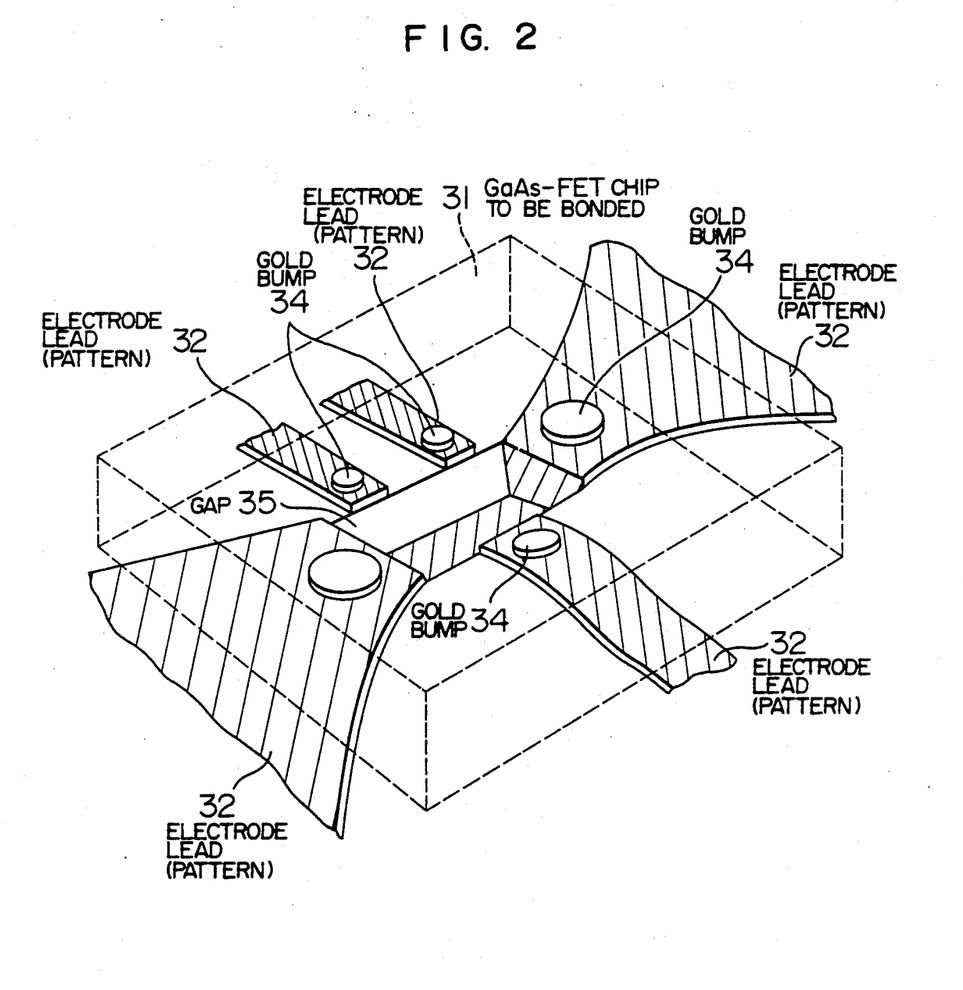
FIG. 2 is an enlarged perspective view in the neighborhood of the bumps of the semiconductor device of FIGS. 1A and 1B.

FIG. 2 is an enlarged perspective view in the neighborhood of the bumps 34. In this embodiment, the height and diameter of the gold bumps 34 are set for 50 to 100 μm and 500 μmϕ, respectively. The height of the bumps 34 must be set for a value larger than a prescribed value; if not, the parasitic capacitance is increased to deteriorate the characteristic of the semiconductor device.

In this embodiment, it is not necessary to form bumps on the expensive high frequency semiconductor device, and the polyimide film as a flexible film, which is less expensive and has a lower permitivity than alumina ceramic used in the ordinary ceramic package, is used so that the semiconductor device can be realized with a low floating capacitance at very low cost.

Meanwhile, in order for the semiconductor device to acquire excellent high frequency performance, it is essential to be able to take electrical isolation, which is represented by $-|S_{12}|$, between the input and output of the semiconductor device. The degree of isolation substantially depends on the coupling capacitance between the input and output. Where the input/output electrodes are formed on the polyimide film as in this embodiment, the isolation will be deteriorated because of the absence of an earth pattern for shielding between the input and output unlike the prior art as shown in FIGS. 6A and 6B. In the FET 31 chip actually used, its source and drain are very near to each other (the distance therebetween is very short as about 3 μm) so that the degree of isolation at this portion is critical for the high frequency semiconductor device. In this embodiment, in order to obviate this, as shown in FIG. 1B, a recessed portion (gap) 35 having a depth of about 200 μm–300 μm is formed between the input electrode and output electrode on the flexible film 30; without the presence of e.g. resin having large permittivity the input and output are isolated by an air layer thus formed to enhance the degree of isolation. Further, the source electrode lead 32 (S) is extended on the surface of the gap 35 to provide the shielding effect so that the degree of electric isolation can be further enhanced. Thus, in an example of packaging a HEMT semiconductor chip which is a kind of GaAs FET the degree of isolation can be improved by 5 dB in a Ku band as shown in the following table. This result is very advantageous for the high frequency semiconductor device for 9 Hz or higher. Also, the noise factor NF can be improved by 0.1 dB.

TABLE

|  | ISOLATION | NF |
| --- | --- | --- |
| THIS EMBODIMENT (PRESENCE OF GAP) | −25 dB | 0.8 dB |
| NO GAP | −20 dB | 0.9 dB |

(measured at the frequency of 12 GHz)

The semiconductor chip 31 bonded to the electrode leads 32 on the flexible film 30 through the bumps 34 is sealed by the ceramic cap 36. Such sealing is incomplete to remove humidity; however, this is not significant as long as the semiconductor chip 31 is completely passivated by SiN. The package constructed in accordance with this embodiment is not so different from the conventional ceramic package in appearance so that the completed semiconductor device can be mounted in a circuit in substantially the same way as the conventional process.

Figure 3A:
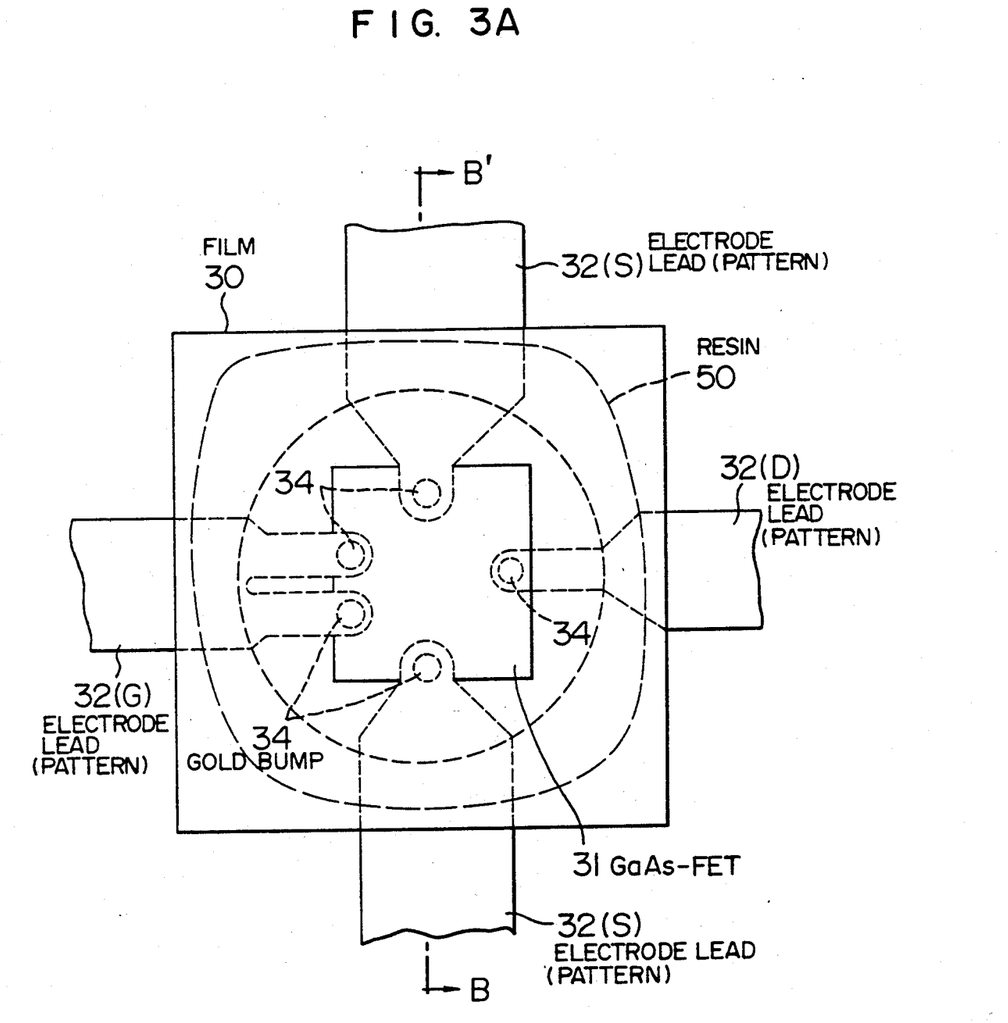
FIG. 3A is a plan view of the main part of a modified semiconductor device in which the semiconductor chip is molded by resin in place of being sealed by the ceramic case shown in FIGS. 1A, 1B and 2.
Figure 3B:
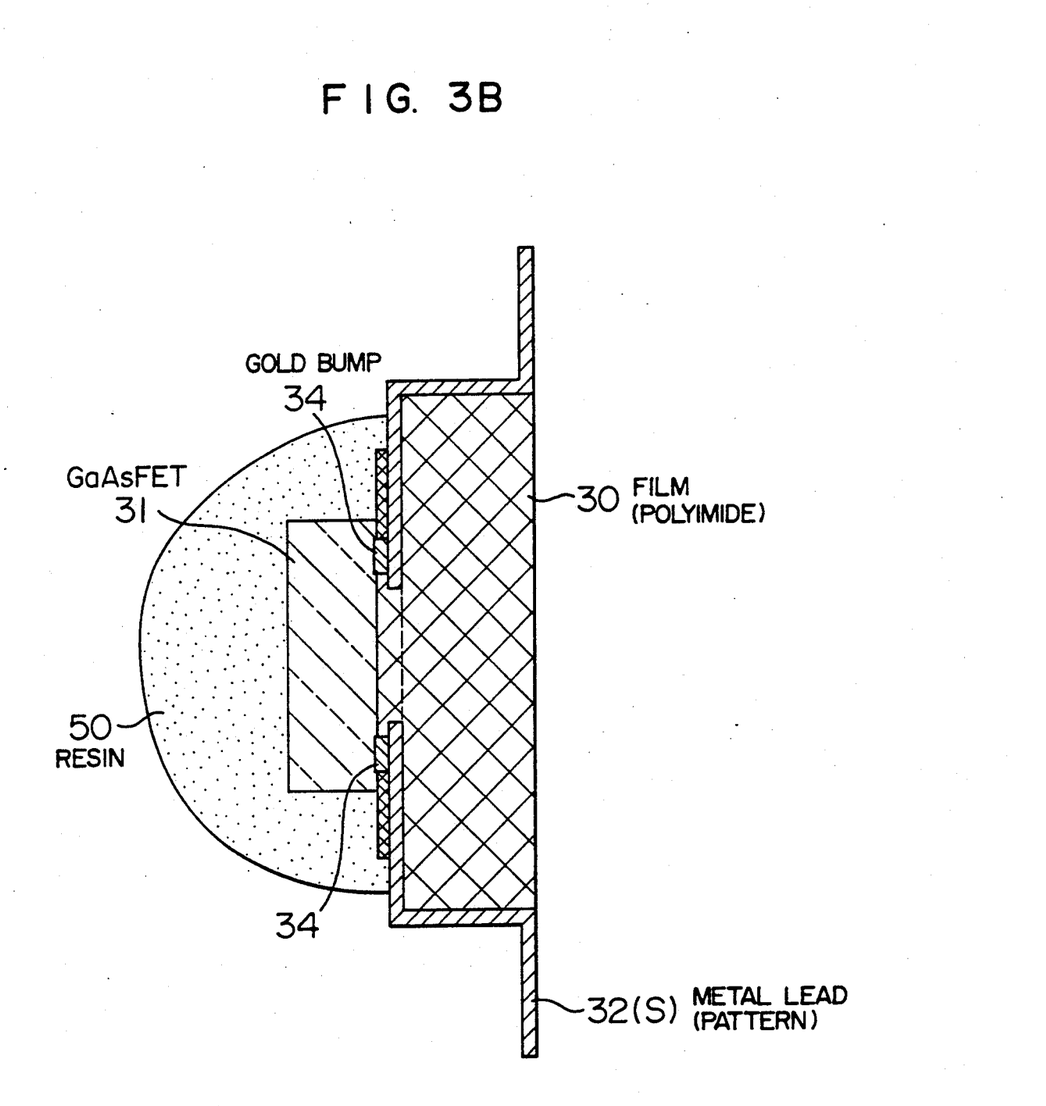
FIG. 3B is a sectional view taken along line B—B' of FIG. 3A.

Further, the semiconductor chip may be molded by resin as shown in FIGS. 3A and 3B or covered with a flexible resin film in place of being sealed by the ceramic case 60.

Embodiment 2

Figure 4A:
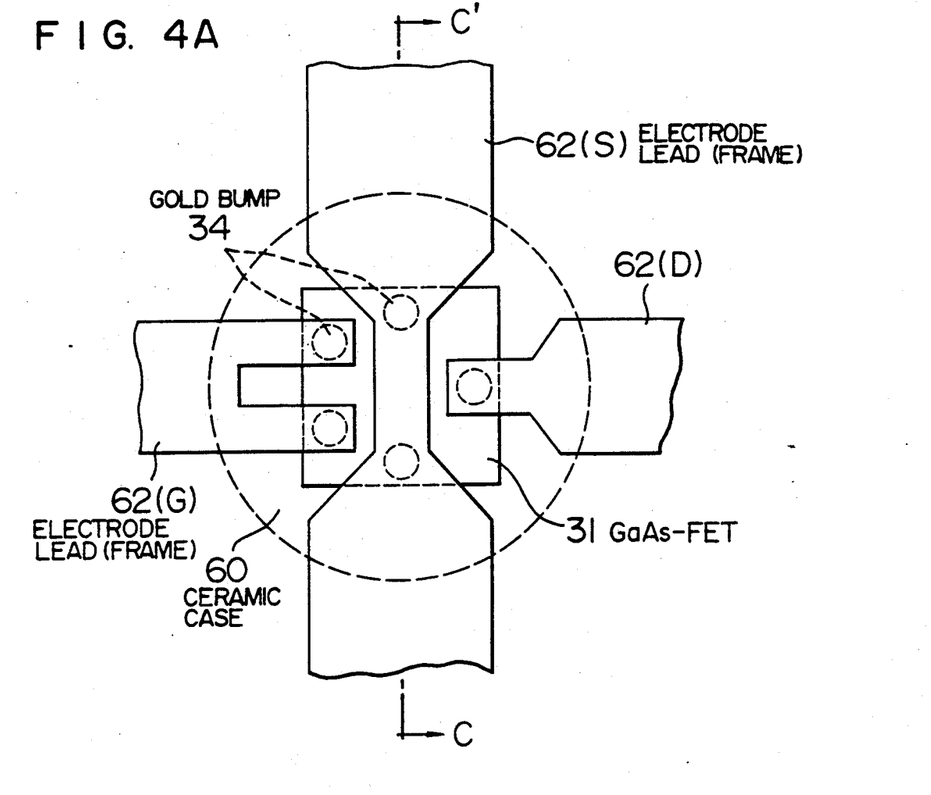
FIG. 4A is a plan view of the main part of a semiconductor device according to another embodiment of the present invention.
Figure 4B:
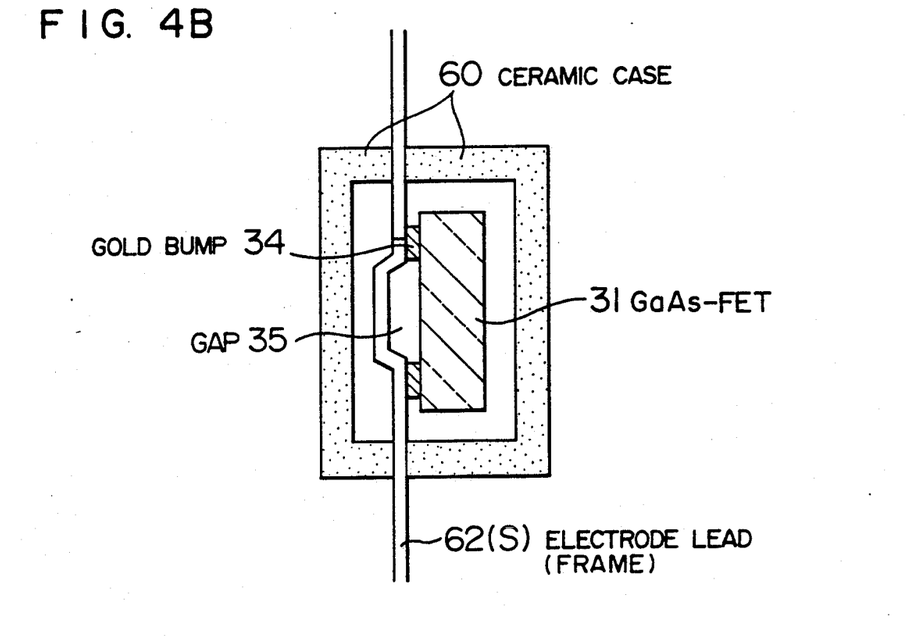
FIG. 4B is a sectional view taken along line C—C' of FIG. 3A.
Figure 5:
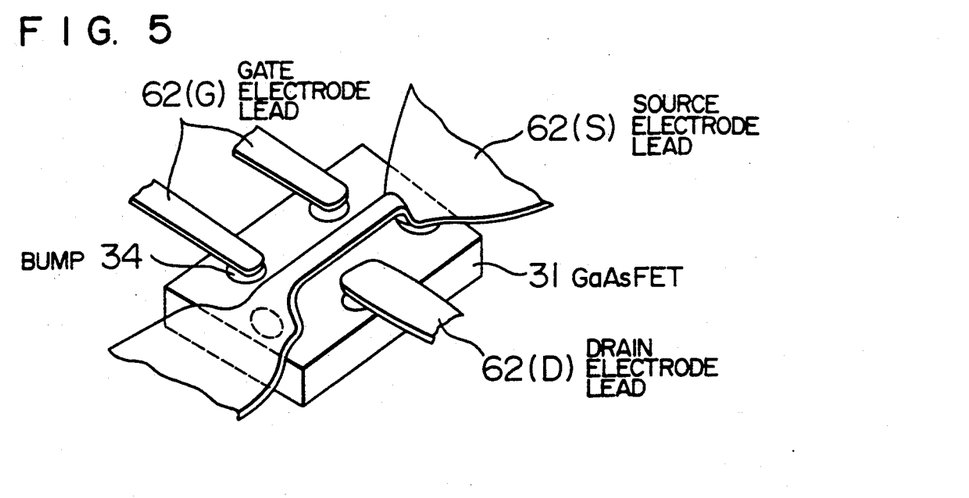
FIG. 5 is an enlarged perspective view of the semiconductor device of FIG. 4A.

FIGS. 4A and 4B shows the high frequency semiconductor device according to still another embodiment of the present invention; this embodiment provides a beam lead type semiconductor device. FIG. 5 shows an enlarged view of the semiconductor device in the neighborhood of the bumps 34. As seen from FIG. 5, bumps 34 are formed on leads 62 to be constructed by a lead frame by e.g. the duplicating bumping technique as mentioned previously. The respective leads are made integral at the position not shown.

The process for fabricating the semiconductor device according to this embodiment will be explained. First, as seen from FIG. 4B, in order to provide the shielding effect between the input and the output of the FET chip 31, or between the gate and drain thereof, the source electrode lead 62 (S) is bent to provide a recessed portion or gap 35. Thereafter, bumps are attached on the leads as shown in FIGS. 4A and 5. The source electrode lead 62 (S) is not required to be bent to provide a recessed portion as long as the bumps 34 are 50 μm or higher. Next, as seen from FIGS. 4A and 4B, a ceramic case 60 is attached to sandwich the leads 32. Finally, the integral portion (not shown) of the leads, i.e. a part of the lead frame is cut to separate the leads individually. In this way, the beam lead type semiconductor device is completed. The semiconductor chip, in place of being sealed by the ceramic case 60, may be molded by resin as shown in FIGS. 3A and 3B or covered with a flexible resin film. The beam lead type semiconductor device thus completed has advantages of very small size and low cost (about half the conventional device using the ceramic package).

In accordance with the present invention, a superior high frequency characteristic and low cost can be realized simultaneously for the high frequency semiconductor device operating at 3 GHz or higher. This is advantageous for reducing the production cost of an SHF converter used in broadcasting-by-satellite or satellite communication. Thus, the present invention has high industrial value in fabricating the high frequency semiconductor device with high performance.

We claim:

1. A high frequency semiconductor device comprising: a flexible film; metal electrode patterns formed on one surface of said flexible film; a plurality of bumps formed on selected portions of the electrode patterns; said flexible film comprising a recessed portion defining an air layer portion within a region bounded by said plurality of bumps; and a plurality of electrode pads of a high frequency semiconductor element respectively bonded to the plurality of bumps in alignment with each other; wherein a surface of said recessed portion formed on the flexible film is at least partially covered with a portion of said metal electrode patterns electrically connected through respective ones of said bumps to the electrode pads of said semiconductor element; and said portion of said patterns and said air layer portion of said flexible film are provided between an input of said metal electrode patterns and an output of said metal electrode patterns in order to prevent electromagnetic coupling therebetween.

2. A high frequency semiconductor device according to claim 1, wherein said flexible film, said plurality of bumps, said electrode pads, said semiconductor chip and a portion of said metal electrode patterns are covered with a ceramic cap to be hollow-sealed;

3. A high frequency semiconductor device comprising:

a plurality of lead frames including an input portion and an output portion; a plurality of bumps formed on a selected portion of a surface of each of said lead frames; one of said lead frames, which extends between said input portion and said output portion, having a recessed portion defining an air layer portion between said input portion and said output portion and within a region bounded by said plurality of bumps, thereby suppressing electromagnetic coupling between said input portion and said output portion; and a plurality of electrode pads of a high frequency semiconductor element respectively bonded to said plurality of bumps in alignment with each other.

4. A high frequency semiconductor device according to claim 3, wherein said selected portion of said lead frames, said plurality of bumps, said recessed portion, said plurality of electrode pads, and said chip are covered with a ceramic cap to be hollow-sealed.

* * * * *